(12) United States Patent
Rossum (10) Patent No.: US 9,337,805 B2
(45) Date of Patent: May 10, 2016

(54) EFFICIENT DIGITAL MICROPHONE DECIMATION FILTER ARCHITECTURE

(71) Applicant: Creative Technology Ltd, Singapore (SG)

(72) Inventor: David Philip Rossum, Santa Cruz, CA (US)

(73) Assignee: Creative Technology Ltd, Singapore (SG)

( * ) Notice: Subject to any disclaimer, the term of this patent is extended or adjusted under 35 U.S.C. 154(b) by 322 days.

(21) Appl. No.: 13/633,092

(22) Filed: Oct. 1, 2012

(65) Prior Publication Data

US 2013/0083945 A1  Apr. 4, 2013

Related U.S. Application Data

(60) Provisional application No. 61/542,098, filed on Sep. 30, 2011.

(51) Int. Cl.
*H04B 15/00* (2006.01)
*H03H 17/02* (2006.01)
*H03H 17/04* (2006.01)

(52) U.S. Cl.
CPC ......... *H03H 17/0288* (2013.01); *H03H 17/045* (2013.01); *H03H 17/0233* (2013.01); *H03H 2017/0247* (2013.01); *H03H 2017/0472* (2013.01)

(58) Field of Classification Search
CPC ....................................................... H04R 3/00
USPC ............................. 381/99, 98, 103; 708/313
See application file for complete search history.

(56) References Cited

U.S. PATENT DOCUMENTS

| 5,027,306 | A |   | 6/1991  | Dattorro et al. |
|-----------|---|---|---------|-----------------|
| 5,258,939 | A |   | 11/1993 | Johnstone et al. |
| 5,787,125 | A |   | 7/1998  | Mittel |
| 5,900,570 | A |   | 5/1999  | Rossum |
| 7,280,878 | B1 |  | 10/2007 | Rossum |
| 7,774,394 | B2 | * | 8/2010 | Menkhoff ..................... 708/313 |
| 7,856,283 | B2 |  | 12/2010 | Burk et al. |
| 2007/0156800 | A1 | | 7/2007 | Sturza et al. |
| 2008/0256157 | A1 | * | 10/2008 | Bostaman et al. ............ 708/306 |
| 2010/0217790 | A1 | | 8/2010 | Yang et al. |

FOREIGN PATENT DOCUMENTS

EP          0213853 A2    3/1987

OTHER PUBLICATIONS

Claudio Becker-Foss, Stephan Flock, Helmut Jahne, Christian Langen, Martin Werwein, Helmut Wittek, White Paper: Digital Microphone and AES42; v2.1 May 11, 2010.

(Continued)

*Primary Examiner* — Alexander Jamal
(74) *Attorney, Agent, or Firm* — Russell Swerdon; Desmund Gean (57) ABSTRACT

A new and more efficient filtering system (e.g., digital microphone decimation filter architecture system) is described. A key to this architecture is the use of two parallel filter paths. Each path operates at the output sample rate, and comprises a shorter FIR filter followed by a series of allpass stages (e.g., implementing IIR filters). The FIR filter is designed to remove all but the last octave of out-of-band noise. The allpass stages are designed such that when the two paths are summed together, the out-of-band noise for the final octave cancels out, leaving only the desired sign.

19 Claims, 4 Drawing Sheets

(56) References Cited

OTHER PUBLICATIONS

Farooq U. et al, "Transformation to implement computationally efficient IIR decimation filters", Digital Signal Processing, Academic Press, Orlando, FL, US, vol. 19, No. 1, published Jan. 1, 2009, pp. 33-44.

Hakan Johansson et al, "High-Speed Recursive Digital Filters Based on the Frequency-Response Masking Approach", IEEE Transactions on Circuits and Systems II: Analog and Digital Signal Processing, Institute of Electrical and Electronics Engineers Inc, 345 East 47 Street, New York, NY 10017, USA, vol. 47, No. 1, Jan. 1, 2000, XP011013168, ISSN: 1057-7130.

\* cited by examiner

EFFICIENT DIGITAL MICROPHONE DECIMATION FILTER ARCHITECTURE

BACKGROUND OF THE INVENTION

1. Field of the Invention

The present invention relates to processing signals. More particularly, the present invention relates to a system and method for processing signals pertaining to a filtering system or digital microphone decimation filter.

2. Description of the Related Art

Digital microphones accept a square wave clock at 64 times the ultimate sample rate of their audio signal, and return a stereo bitstream at that clock rate. The bitstream is the output of a $4^{th}$ order sigma-delta modulator. The task of a digital microphone interface is to filter the out-of-band noise from this bitstream and decimate it to the audio rate.

In other words, a digital microphone interface accepts a bitstream at 64 times the output sample rate, and decimates it with filtering to the output sample rate to provide the output digital audio stream as a series of samples. As shown by Dattorro et al. (U.S. Pat. No. 5,027,306, filed May 12, 1989, entitled "Decimation Filter As For A Sigma-Delta Analog-to-Digital Converter"), which contents are incorporated by reference in their entirety herein, this can be done by brute force using a single FIR filter. For 16 bit quality, they show this filter to be of approx order 2048 (symmetric: 4096).

What is desired is a more efficient and improved digital microphone decimation filter architecture system and method for processing signals thereof.

SUMMARY OF THE INVENTION

In accordance with the invention, there is provided a more efficient and improved digital microphone decimation filter architecture.

In one aspect, the invention provides a filtering system for processing an input signal that includes an input interface, a filtering module, and an output interface. The input interface is operable to receive the input signal in a bitstream. The filtering module is operable to process the input signal through a parallel circuit of filters, wherein the processing is performed using a single/common sample rate (e.g., 48 kHz, 32 kHz, etc.). The output interface is operable to generate an output signal based on the processed input signal.

In another aspect, the invention provides a method for processing an input signal with a filtering system. The method includes (a) receiving the input signal in a bitstream; (b) processing the input signal through a parallel circuit of filters, wherein the processing is performed using a single sample rate; and (c) generating from the filtering system an output signal based on the processed input signal.

The invention extends to a machine-readable medium embodying a sequence of instructions that, when executed by a machine (e.g., computer, processor, etc.), cause the machine to carry out any of the methods described herein.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

The invention can be implemented in numerous ways, including as a process, an apparatus, a system, a composition of matter, a computer readable medium such as a computer readable storage medium. In this specification, theses implementations, or any other form that the invention may take, may be referred to as techniques. In general, the order of the steps of disclosed processed may be altered within the scope of the invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting as to the scope of the invention but merely illustrative.

Digital microphones are often used in professional audio applications. Some of the advantages and shortcomings of working with digital microphones are described in a White Paper: "Digital Microphones and AES42" v2.1, May 11, 2010, which contents are incorporated by reference in their entirety herein.

According to various embodiments of the present invention, a new and more efficient digital microphone decimation filter architecture is presented. A key to this architecture is the use of two parallel filter paths. Each path operates at the output sample rate, and comprises a shorter FIR filter followed by a series of allpass stages. The FIR filter is designed to remove all but the last octave of out-of-band noise. The allpass stages (e.g., implemented with IIR filters such as power symmetric elliptic filters) are designed such that when the two paths are summed together, the out-of-band noise for the final octave cancels out, leaving only the desired signal. This architecture has several advantages over previous approaches. Like the approach of Dattorro et al., U.S. Pat. No. 5,027,306, which is incorporated by reference herein, the FIR input is a bitstream; thus, the FIR step comprises only addition operations, and no multiplier is required. In contrast to Dattorro et al., the FIR filter in this architecture is considerably shorter (e.g., order 256), thus the shift register for storing the incoming bitstream is reduced by a factor of at least 8. Unlike the traditional Cascaded Integrator Comb (CIC) approach, this architecture does not use an intermediate sample rate. The allpass filters each operate at the output sample rate, and accept data from the FIR at the output sample rate. Thus the math can be done using a single accumulator. Finally, the allpass filters are of low complexity, requiring only a few multiplies per output sample. This means that an actual parallel multiplier is not required.

Figure 1:
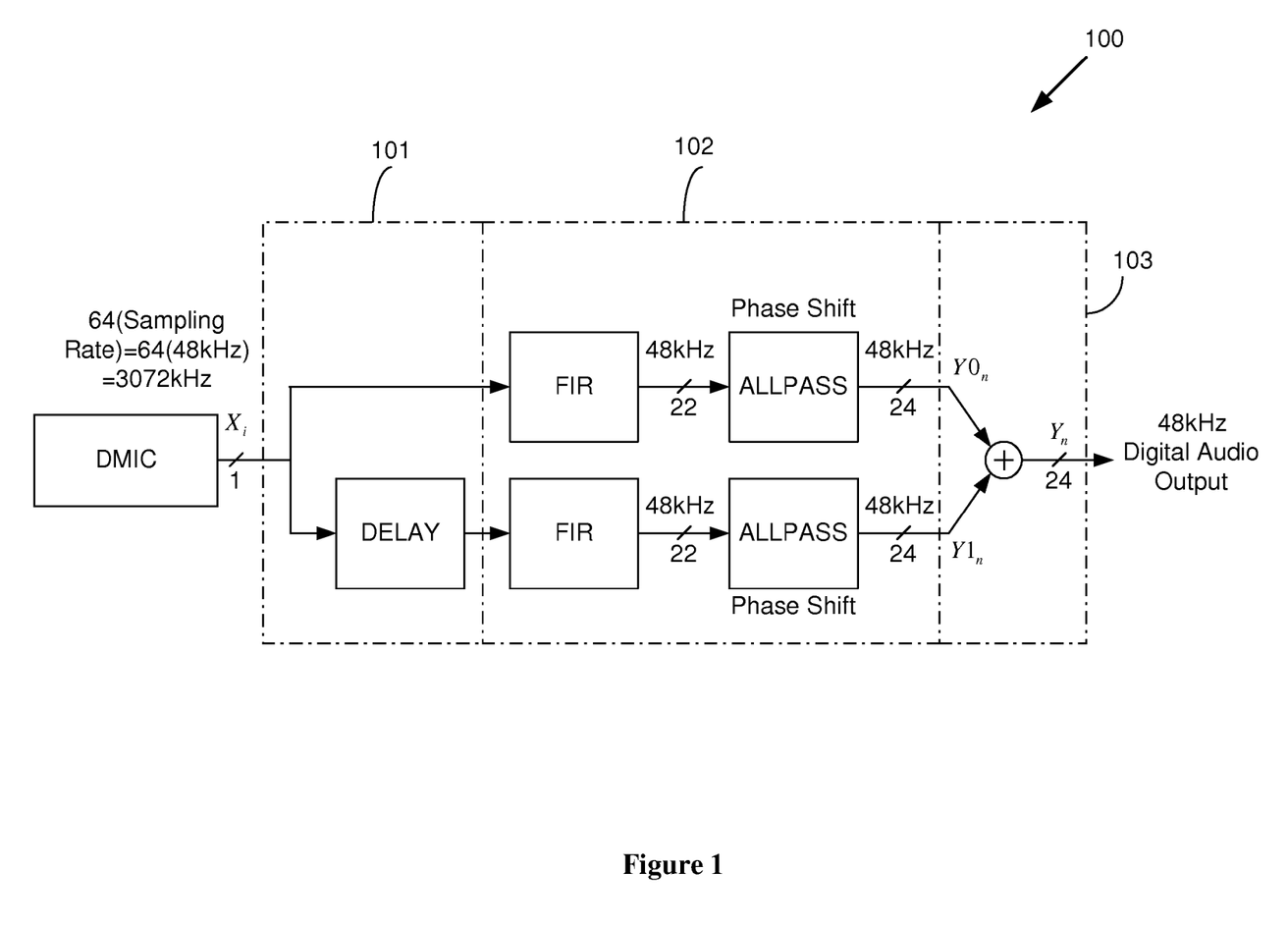
FIG. 1 is a diagrammatic representation of a filtering system (e.g., digital microphone decimation filter architecture system) according to various embodiments of the present invention.

FIG. 1 is a diagrammatic representation of a filtering system 100 (e.g., digital microphone decimation filter architecture system) according to various embodiments of the present invention. Filtering system 100 includes an input interface 101, a filtering module 102, and an output interface 103. From the digital microphone (DMIC), a bitstream at 64× sample rate (e.g., 64×48 kHz=3.072 MHz) at 1 bit wide is received at input interface 101, which is then processed by two parallel FIR filters. Each FIR filter operate at the sample rate. Each FIR filter generates an output word (e.g., 22 bit at 48 kHz). The bitstream is then processed by two IIR Allpass filters. Each IIR Allpass filter operate at the sample rate and can change the phase but not the amplitude of the received signal. Each IIR Allpass filter generates an output word (e.g., 24 bit at 48 kHz), which are sum together to generate a digital audio output at the sample rate. It is appreciated that according to various embodiments, filtering module 102 does not implement a multi-sample rate design, but rather a single rate design. The design criteria can be based on 16 bit quality—noise below −96 db or −100 db. A delay module is presented so that one of the FIR filter is operating at half the 64× sample rate (therefore, 32 sample @ 48 kHz) out of step from the other FIR filter. Since IIR Allpass filters can change the phases, the output of the Allpass filters can be in phase for summation resulting in reinforcement of the sample point and cancellation of half the sample point away. Therefore, a more efficient filtering system can be realized.

Detailed Mathematical Basis

Figure 2:
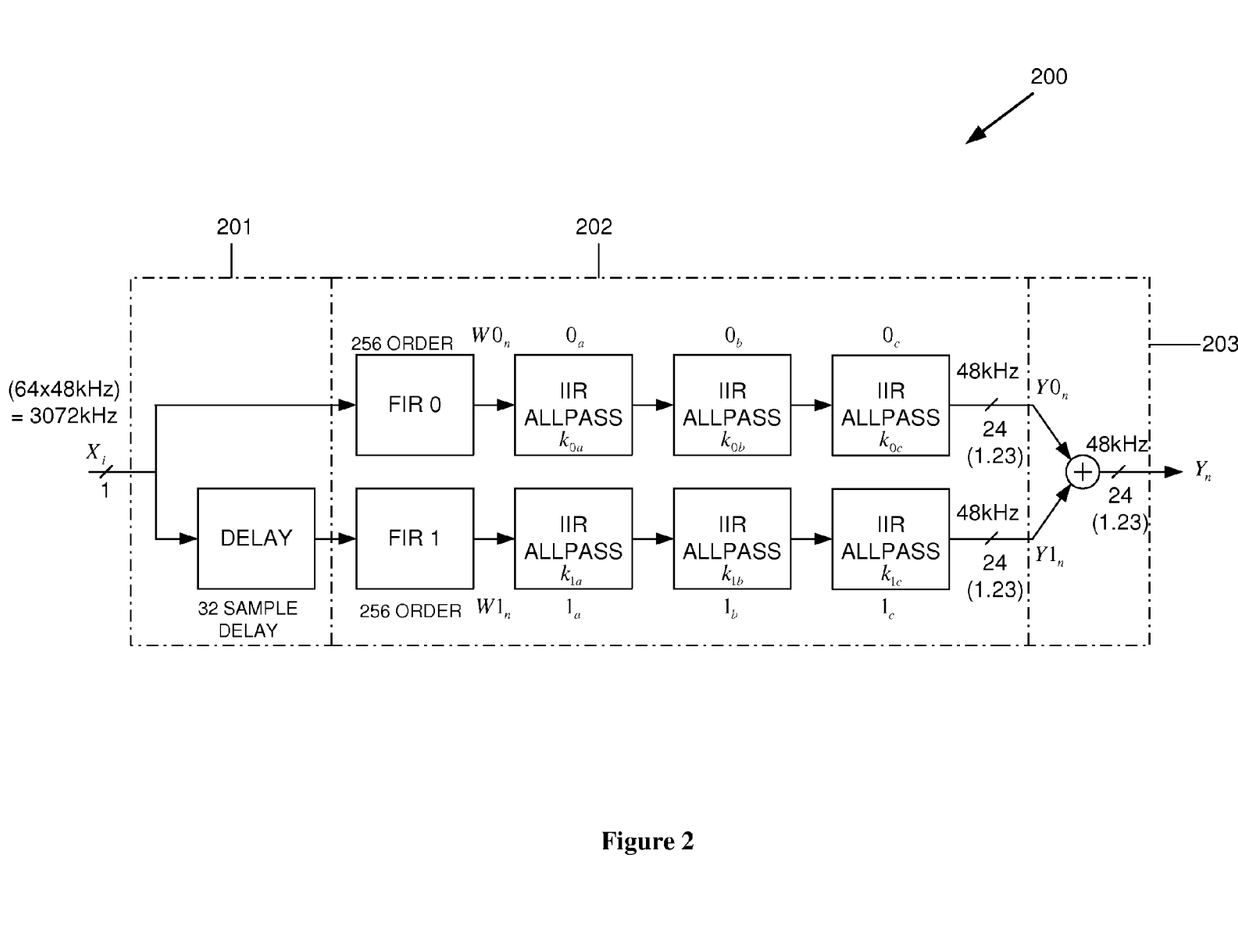
FIG. 2 is a diagrammatic representation of a filtering system (e.g., digital microphone decimation filter architecture system) according to various embodiments of the present invention.

FIG. 2 is a diagrammatic representation of a filtering system 200 (e.g., digital microphone decimation filter architecture system) according to various embodiments of the present invention. Filtering system 200, which is similar to filtering system 100, includes an input interface 201, a filtering module 202, and an output interface 203. The input bitstream, represented as $X_i$, is a series of single bit values representing either a +1 or −1 signal, having a sample rate 64 times the output sample rate. The output signal is represented as $Y_n$, a stream of 24 bit words in 1.23 two's complement format at output sample rate. The time relation between n and i is that i runs at a rate 64 times that of n, and that a minimum of 288 values of $X_i$ must be received for the calculation of $Y_n$. It is convenient to define $X_0$ as the input sample received just prior to begin to compute $Y_0$. Note that the actual delay between receipt of $X_i$ and the output of $Y_n$ is arbitrary. However, the delay should be consistent among all channels, and as small as practical.

The output sample $Y_n$ is the sum of two substreams, $Y0_n$ and $Y1_n$, also operating at the output sample rate. In other words:

$$Y_n = Y0_n + Y1_n$$

Figure 3A:
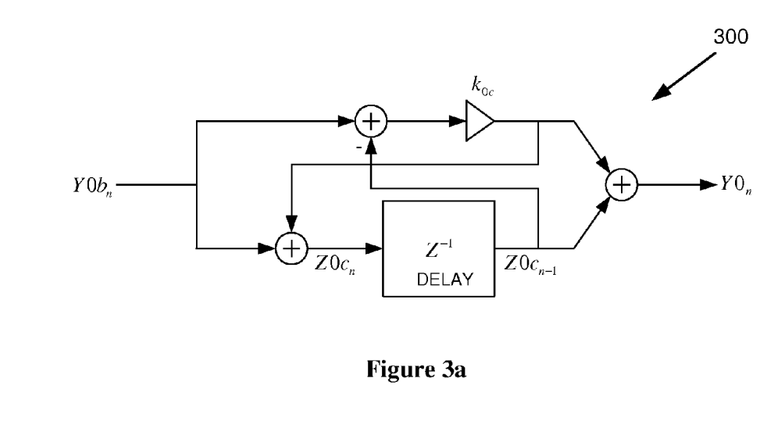
FIG. 3a is a diagrammatic representation of a component (e.g., an IIR allpass filter implemented in "one-multiply" form) of the filtering system according to various embodiments of the present invention.
Figure 3B:
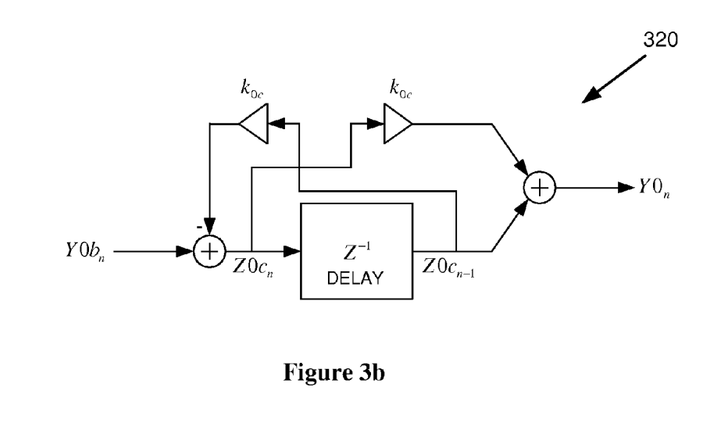
FIG. 3b is a diagrammatic representation of a component (e.g., an IIR allpass filter implemented in "two-multiply" form) of the filtering system according to various embodiments of the present invention.

Each of these substreams is the output of a series of three allpass filters operating at the output sample rate. Each of the six allpass filters has its own filter coefficient k, which is a positive number less than one. Allpass filters can be implemented in a number of ways. For example, FIG. 3a is a diagrammatic representation of a component 300 (e.g., an IIR allpass filter implemented in "one-multiply" form) of the filtering system according to various embodiments of the present invention. The "one-multiply" form requires a single multiplication and three addition operations. For another example, FIG. 3b is a diagrammatic representation of a component 320 (e.g., an IIR allpass filter implemented in "two-multiply" form) of the filtering system according to various embodiments of the present invention. The "two-multiply" form requires two multiplications and two addition operations. For exemplary purposes, both FIGS. 3a and 3b are based on the 0c IIR Allpass filter in FIG. 2, which can be adapted for any of the other IIR Allpass filters (e.g., 0a, 0b, 1a, 1b, 1c) in FIG. 2 as well. The results are mathematically equivalent. Both will be described here; the "two-multiply" form seems more appropriate for an optimal implementation.

Each of the filter sections will be denoted by its substream number (0 or 1) and its section letter (a, b or c). Each filter has a coefficient k, and a delay memory $Z_n$. In the one multiply form, substream 0 can be described:

$$Y0_n = Z0c_{n-1} + k_{0c}(Y0b_n - Z0c_{n-1})$$

$$Z0c_n = Y0b_n + k_{0c}(Y0b_n - Z0c_{n-1})$$

$$Y0b_n = Z0b_{n-1} + k_{0b}(Y0a_n - Z0b_{n-1})$$

$$Z0b_n = Y0a_n + k_{0b}(Y0a_n - Z0b_{n-1})$$

$$Y0a_n = Z0a_{n-1} + k_{0a}(W0_n - Z0a_{n-1})$$

$$Z0a_n = W0_n + k_{0a}(W0_n - Z0a_{n-1})$$

Or in the two multiply form:

$$Y0_n = Z0c_{n-1} + k_{0c}Z0c_n$$

$$Z0c_n = Y0b_n - k_{0c}Z0c_{n-1}$$

$$Y0b_n = Z0b_{n-1} + k_{0b}Z0b_n$$

$$Z0b_n = Y0a_n - k_{0b}Z0b_{n-1}$$

$$Y0a_n = Z0a_{n-1} + k_{0a}Z0a_n$$

$$Z0a_n = W0_n - k_{0a}Z0a_{n-1}$$

In both cases $W0_n$ is the output of the FIR filter for substream 0. Substream 1 is similar:

$$Y1_n = Z1c_{n-1} + k_{1c}(Y0b_n - Z1c_{n-1})$$

$$Z1c_n = Y1b_n + k_{1c}(Y0b_n - Z1c_{n-1})$$

$$Y1b_n = Z1b_{n-1} + k_{1b}(Y0a_n - Z1b_{n-1})$$

$$Z1b_n = Y1a_n + k_{1b}(Y0a_n - Z1b_{n-1})$$

$$Y1a_n = Z1a_{n-1} + k_{1a}(W0_n - Z1a_{n-1})$$

$$Z1a_n = W1_n + k_{1a}(W0_n - Z1a_{n-1})$$

Or in the two multiply form:

$$Y1_n = Z1c_{n-1} + k_{1c}Z1c_n$$

$$Z1c_n = Y1b_n - k_{1c}Z1c_{n-1}$$

$$Y1b_n = Z1b_{n-1} + k_{1b}Z1b_n$$

$$Z1b_n = Y1a_n - k_{1b}Z1b_{n-1}$$

$$Y1a_n = Z1a_{n-1} + k_{1a}Z1a_n$$

$$Z1a_n = W1_n - k_{1a}Z1a_{n-1}$$

Figure 4:
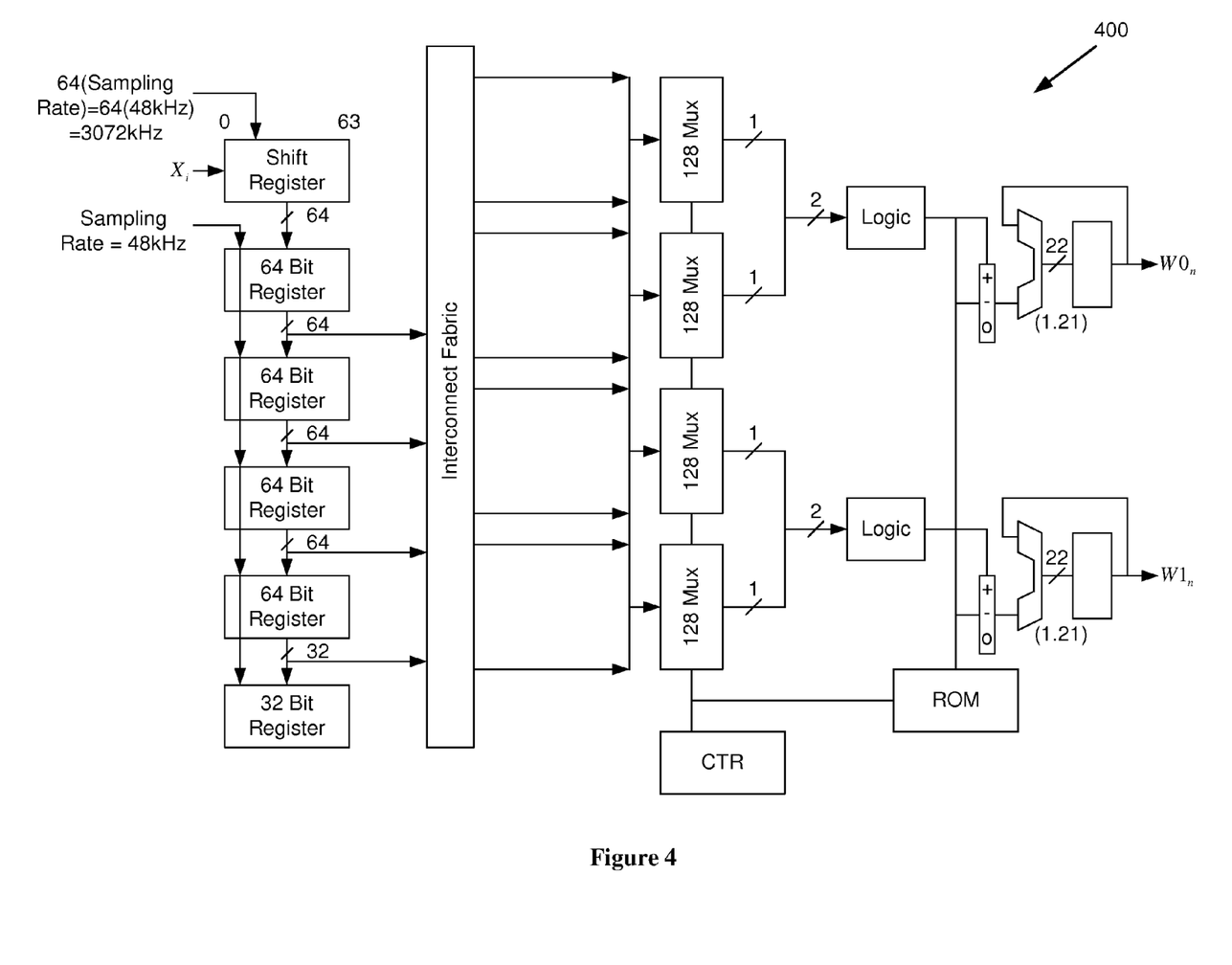
FIG. 4 is a diagrammatic representation of a component (e.g., FIR) of the filtering system (e.g., digital microphone decimation filter architecture) according to various embodiments of the present invention.

The FIR filter outputs are the sums of products of the FIR filter coefficients $C_j$ times the corresponding input values $X_i$. The 256 coefficients are even (symmetric with or without a central value), so that $C_0 = C_{255}$, $C_1 = C_{254}$, etc. The two substreams use the same coefficients, but operate on data spaced one half output sample (or 32 input samples) apart. Thus:

$$W0_n = C_0 X_{(64n-255)} + C_1 X_{(64n-254)} \ldots + C_{255} X_{(64n)}$$

$$W1_n = C_0 X_{(64n-287)} + C_1 X_{(64n-286)} \ldots + C_{255} X_{(64n+32)}$$

Implementation

A digital microphone decimation filter module/system implementing a preferred embodiment of the present invention processes N stereo streams of digital microphone data, at a clock rate R which can be either 3.072 MHz or 2.048 MHz. The module/system produces 2*N audio output streams, at a sample rate of 48 or 32 kHz respectively, compatible with the audio router.

The digital microphone interface comprises a single clock output pin DMIC_MCLK producing a square wave at the selected clock rate R, and N input pins DMIC_SDIn accepting a bit stream from a stereo pair of digital microphones. The format of this data is described in Appendix 1 below.

The control interface for the module/system comprises a rate select input DMIC_RATE which selects the value of R, and an enable bit for each of the N streams. When the enable bit is negated, the associated DMIC_SDI input is ignored, the audio data output is not computed, and the associated delay registers are cleared to zero. When all enable bits are negated, the DMIC_MCLK becomes quiescent at a zero value.

The module/system contains a single coefficient ROM (presumably a synthesized logic ROM) containing the $C_i$ coefficients. The coefficients are 18 bits, and because they are symmetric, only 128 coefficients are stored. The $C_i$ coefficients have maximum decimal significance of around 0.025. They are stored at 32 times their actual value, that is with a value slightly less than 1 for the largest coefficient ($C_{127}$), in 1.17 format. The factor of 32 comprises a factor of 2 because of the pairing of operations (see below), and a scale factor of 16.

Because the input data stream $X_i$ is a stream of single bits, no multiplication is required in the computation of $W_n$; the sums can be produced by conditional additions or subtractions. Because the coefficients are symmetric, only 128 conditional add/subtracts are required per sum. If the two input samples associated with a given coefficient are different, the accumulator remains unchanged; if both are 1, two times the coefficient is added, and if both are 0, two times the coefficient is subtracted. Because of this pairing, the ROM value represents twice the value of the coefficient.

The resulting Wi signal is guaranteed to have a value within [−1, 1] when the coefficients have their proper value; with scaling the value is now [−16, 16], implying that there are 4 bits of word growth in the sum of products operation.

Were the accumulator to merely accommodate the FIR operation, it must have 22 bits, in 5.17 format with scaling, or equivalently 1.21 format when the result is scaled back to unity gain.

Based on the above, each of the two substreams will have its own accumulator. At the beginning of each 48 kHz sample period, both accumulators for each channel are cleared. Then the 128 values of the coefficient ROM are sequentially accessed. For each substream for each channel, the two shift register bits associated with that ROM are examined. For example, for substream 1 and $C_1$, $X_{(64n-254)}$ and $X_{(64n-1)}$ are examined. If they are of different values, nothing is added into the accumulator. If they are both 1, then the coefficient is added to the accumulator; if they are both zero, the coefficient is subtracted from the accumulator. After all 128 coefficients are processed, the accumulators contain the $W0_n$ and $W1_n$ values. Next the allpass filters can be implemented.

FIG. 4 is a diagrammatic representation of a component 400 (e.g., FIR) of the filtering system (e.g., digital microphone decimation filter architecture) according to various embodiments of the present invention. A simple architecture of component 400 to implement the shift registers uses a 64 long, 1 bit wide input shift register to acquire 64 single bit values for each channel during each 48 kHz sample period. At the end of sample period prior to when $Y_n$ is being computed, this will contain values $X_{(64n-63)}$ through $X_{(64n)}$. These 64 bits are then shifted as a 64 bit word into a 64 bit wide×5 word long compute shift register. During the sample period when $Y_n$ is being computed, this contains $X_{(64n-319)}$ through $X_{(64n)}$. Note that 32 bits of the final word of this shift register (containing $X_{(64n-319)}$ through $X_{(64n-288)}$) are never used and need not exist.

The allpass filter nodes can have word growth, so that even though the $W0_n$ and $W1_n$ values are limited to [−1, 1], the accumulator should have some headroom. Furthermore, since the multiplications in the allpass filters can produce fractional bits, some footroom is also beneficial. Two bits of footroom are sufficient. The two multiply allpass internal node is a highpass pole, so its gain is $1/(1-k)$. Since the largest k we have is about 0.9, the gain is about 10, so 4 bits of headroom are necessary. The actual format of the accumulators is thus 5.23. The delay memories $Zij_n$ are in the same format.

The 6 $K_{ij}$ coefficients are positive numbers, 16 bits in 0.16 format (see Appendix 2). The multiplications can be implemented as hard-coded shift and add operations, thus these coefficients are not stored in any ROM.

Use of the two multiply form of the allpass allows storage to be minimized. The multiplications are implemented as adds and subtracts of the shifted multiplicand to the accumulator. The sequence of operations is as follows (the example is for substream 0):

Begin with $W0_n$ in the accumulator, and $Za0_{n-1}$ in the 'a' delay memory, $Zb0_{n-1}$ in the 'b' delay memory, and $Zc0_{n-1}$ in the 'c' delay memory.

Multiply the contents of the 'a' delay memory by $-k_{0a}$ and accumulate the result. The accumulator now contains $W0_n - k_{0a}Z0a_{n-1} = Z0a_n$.

Swap the accumulator and the 'a' delay memory. The accumulator now contains $Za0_{n-1}$ and the delay memory contains $Z0a_n$.

Multiply the contents of the 'a' delay memory by $k_{0a}$ and accumulate the result. The accumulator now contains $Za0_{n-1} + k_{0a}Z0a_n = Y0a_n$.

Multiply the contents of the 'b' delay memory by $-k_{0b}$ and accumulate the result. The accumulator now contains $Y0a_n - k_{0b}Z0b_{n-1} = Z0b_n$.

Swap the accumulator and the 'b' delay memory. The accumulator now contains $Zb0_{n-1}$ and the delay memory contains $Z0b_n$.

Multiply the contents of the 'b' delay memory by $k_{0b}$ and accumulate the result. The accumulator now contains $Zb0_{n-1}+k_{0b}Z0b_n.=Y0b_n$.

Multiply the contents of the 'c' delay memory by $-k_{0c}$ and accumulate the result. The accumulator now contains $Y0b_n-k_{0c}Z0c_{n-1}.=Z0c_n$.

Swap the accumulator and the 'c' delay memory. The accumulator now contains $Zc0_{n-1}$ and the delay memory contains $Z0c_1$.

Multiply the contents of the 'c' delay memory by $k_{0c}$ and accumulate the result. The accumulator now contains $Zc0_{n-1}+k_{0c}Z0c_n.=Y0_n$.

In parallel, the analogous process is done to substream 1.

Finally, the two substreams are added together, the result is saturated from its 5.23 format to [−1, 1] as 1.23 format, and then output to the audio router.

The above process can be repeated for additional channels using the same accumulators but different delay memories. 256 clocks should be allocated for each channel.

The Total Facilities Required:
Shared Resources for All Channels:
18 bit by 128 word ROM
Control logic including coding of the 'k' coefficients
Per Channel Resources:
352 bits of shift register and associated muxes
24 bits of output register
168 bits of delay memory and associated muxes
Time Shared Among Channels for Each Accumulator Pair:
56 bits of accumulator
2 28 bit adder/subtractors
Quality This implementation has been designed to meet "16 bit" quality standards. It is possible to use a shorter FIR and shorter coefficient words to decrease the resources further at the cost of audio quality. Such tradeoffs could be more thoroughly investigated in MATLAB.

Appendix 1: Digital Microphone Interface Format

The digital microphones all operate using an interface comprising a DMIC_MCLK signal, which is a square wave clock input into one or two digital microphone circuits, and a DMIC_SDI signal, which is the data output from the digital microphone circuits. When two mics are used, they are configured so that the DMIC_SDI from both mics is multiplexed into one signal line for the stereo configuration.

a. Signal Voltages and Levels

Digital Microphone pads must be designed to accommodate the particular digital microphones used.

b. Signal Timing

The DMIC_MCLK signal is a 50% duty cycle square wave at 64 times the sample frequency. At 48 kHz sample rate, this means a clock of 3.072 MHz. Some microphones (e.g., a National product) have a maximum clock frequency of 2.4 MHz; this does not allow for full audio bandwidth operation. Some microphones also operate at a clock frequency of 2.048 MHz, and thus a sample rate of 32 kHz.

The DMIC_SDI data input signal provides Pulse Density Modulation (PDM) information as "left" data in response to the falling edge of DMIC_MCLK, and "right" data in response to the rising edge. The data delay time from the active edge of DMIC_MCLK to valid data on DMIC_SDI varies among the manufacturers, as does the hold time of valid data on DMIC_SDI following the subsequent DMIC_MCLK transition. An optimum interface should latch the DMIC_SDI data on the MCLK falling edge immediately prior to the next DMIC_MCLK transition. This will allow the maximum timing margin on the DMIC_SDI data delay, without placing any restriction on a positive value for its hold time. Assuming no signal skew, this design allows for data delay timing margins of 89 nsec and 113.25 nsec, and data hold margins of 48 nsec and 106 nsec respectively for Akustica and National parts. See the timing diagrams below for details.

Note that while some microphones specify that there is a finite (typically 200 msec) "data invalid" time during power-up, there is no need to deal with this in the hardware.

48 kHz Sample Rate, 3.072 MHz DMIC_MCLK
MCLK xssazzxssazzxssazzxssazzxssazzxssazzxs
DMIC_MCLK azzzzzzzzzzzzxssssssssssssazzzzzzzzzzzzxs
DataStrobe zzzzzzzzzzxssazzzzzzzzxssazzzzzzzzxssaz
DMIC_SDI ␣r43␣left␣␣␣␣r43␣right␣␣␣r43␣left␣␣␣␣r
33 nsec 0=0=7 nsec Data delay of 33 nsec, data hold of 7 nsec typical of Akustica parts. DMIC_SDI is sampled on the rising edge of DataStrobe.

32 kHz Sample Rate, 2.048 MHz DMIC_MCLK
MCLK xsazxsazxsazxsazxsazxsazxsazxsazxs
DMIC_MCLK azzzzzzzzzzzzxsssssssssssazzzzzzzzzzzzxs
DataStrobe zzzzzzzzzzxssazzzzzzzzxssazzzzzzzzxsaz
DMIC_SDI ␣␣r443␣left␣␣␣r443␣right␣␣r443␣left␣␣␣
90 nsec 0=65 nsec Data delay of 90 nsec, data hold of 65 nsec typical of National parts. DMIC_SDI is sampled on the rising edge of DataStrobe.

Appendix 2: Allpass Filter Coefficients

These coefficients correspond to requirements of 96 dB attenuation at 28 kHz:

$$k_{0a}=2894/65536=0.0442$$

$$k_{0b}=21667/65536=0.3306$$

$$k_{0c}=46002/65536=0.7019$$

$$k_{1a}=10755/65536=0.1641$$

$$k_{1b}=33747/65536=0.5149$$

$$k_{1c}=58644/65536=0.8948$$

Appendix 3: FIR Filter Coefficients

These coefficients correspond to requirements of +/−0.1 dB ripple 0-20 kHz, 100 dB attenuation 76 kHz to 116 kHz, and 130 dB above 124 kHz. All are expressed as integer values. The actual coefficients are stored effectively as 1.17 format (divided by 131072), and the original FIR values are 1/32 of the these (divided by 4194304): $C_0=1$; $C_1=2$; $C_2=3$; $C_3=4$; $C_4=6$; $C_5=8$; $C_6=11$; $C_7=15$; $C_8=20$; $C_9=26$; $C_{10}=33$; $C_{11}=41$; $C_{12}=51$; $C_{13}=63$; $C_{14}=76$; $C_{15}=91$; $C_{16}=109$; $C_{17}=128$; $C_{18}=149$; $C_{19}=173$; $C_{20}=198$; $C_{21}=225$; $C_{22}=254$; $C_{23}=285$; $C_{24}=317$; $C_{25}=350$; $C_{26}=383$; $C_{27}=416$; $C_{28}=448$; $C_{29}=479$; $C_{30}=507$; $C_{31}=533$; $C_{32}=554$; $C_{33}=569$; $C_{34}=578$; $C_{35}=579$; $C_{36}=571$; $C_{37}=553$; $C_{38}=522$; $C_{39}=478$; $C_{40}=418$; $C_{41}=341$; $C_{42}=247$; $C_{43}=132$; $C_{44}=-4$; $C_{45}=-163$; $C_{46}=-345$; $C_{47}=-553$; $C_{48}=-787$; $C_{49}=-1048$; $C_{50}=-1336$; $C_{51}=-1652$; $C_{52}=-1996$; $C_{53}=-2368$; $C_{54}=-2766$; $C_{55}=-3190$; $C_{56}=-3638$; $C_{57}=-4109$; $C_{58}=-4601$; $C_{59}=-5109$; $C_{60}=-5632$; $C_{61}=-6166$; $C_{62}=-6706$; $C_{63}=-7248$; $C_{64}=-7786$; $C_{65}=-8315$; $C_{66}=-8828$; $C_{67}=-9320$; $C_{68}=-9783$; $C_{69}=-10210$; $C_{70}=-10593$; $C_{71}=-10924$; $C_{72}=-11195$; $C_{73}=-11397$; $C_{74}=-11522$; $C_{75}=-11562$; $C_{76}=-11507$; $C_{77}=-11349$; $C_{78}=-11080$; $C_{79}=-10692$; $C_{80}=-10176$; $C_{81}=-9526$; $C_{82}=-8735$; $C_{83}=-7796$; $C_{84}=-6703$; $C_{85}=-5452$; $C_{86}=-4039$; $C_{87}=-2461$; $C_{88}=-714$; $C_{89}=1201$; $C_{90}=3286$; $C_{91}=5539$; $C_{92}=7958$; $C_{93}=10540$; $C_{94}=13280$; $C_{95}=16172$;

$C_{96}=19210$; $C_{97}=22384$; $C_{98}=25686$; $C_{99}=29105$; $C_{100}=32630$; $C_{101}=36246$; $C_{102}=39940$; $C_{103}=43698$; $C_{104}=47504$; $C_{105}=51340$; $C_{106}=55191$; $C_{107}=59038$; $C_{108}=62862$; $C_{109}=66646$; $C_{110}=70370$; $C_{111}=74016$; $C_{112}=77565$; $C_{113}=80999$; $C_{114}=84299$; $C_{115}=87447$; $C_{116}=90426$; $C_{117}=93220$; $C_{118}=95814$; $C_{119}=98193$; $C_{120}=100343$; $C_{121}=102252$; $C_{122}=103909$; $C_{123}=105305$; $C_{124}=106432$; $C_{125}=107283$; $C_{126}=107853$; $C_{127}=108138$.

Advantages of the present invention allow for an efficient combination of FIR and IIR filters that take advantage of a single bit input signal. The IIR filters allow the FIR to be more efficient by having lesser coefficients (e.g., order 256 vs order 4096). Further, due to the lesser coefficients, a single accumulator (e.g., register) can be used.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A decimation filtering system for processing an input signal, comprising:
    an input interface operable to receive the input signal in a bitstream;
    a filtering module operable to process the input signal through a parallel circuit of filters comprising two paths, wherein the parallel circuit of filters comprises of a FIR filter in series with an IIR filter in each of the two paths of the parallel circuit of filters; and
    an output interface operable to generate an output signal based on the processed input signal, wherein the FIR filter and IIR filter in each of the two paths process the input signal and the output interface generates the output signal at an identical sample rate.

2. The filtering system of claim 1, wherein the input signal is an audio signal.

3. The filtering system of claim 1, wherein the input signal is a single bit digital signal.

4. The filtering system of claim 1, wherein the filtering system is a digital microphone decimation filter architecture system.

5. The filtering system of claim 1, wherein the FIR filter comprises of addition operations and no multiplier operations, and wherein the parallel circuit of filters utilizes a single accumulator.

6. The filtering system of claim 1, wherein one of the paths of the parallel circuit of filters is in series with a delay module in the input interface.

7. The filtering system of claim 1, wherein the parallel circuit of filters processes the input signal such that a last octave of out-of band noise remains in the processed input signal.

8. The filtering system of claim 7, wherein the output interface generates the output signal such that the last octave of out-of band noise is removed from the processed input signal.

9. The filtering system of claim 8, wherein the output interface is operable to perform an addition operation on the processed input signal from each of the two paths of the parallel circuit.

10. A method for processing an input signal with a decimation filtering system, comprising:
    receiving the input signal in a bitstream;
    processing the input signal through a parallel circuit of filters, wherein the parallel circuit of filters comprises of a FIR filter in series with an IIR filter in each of the two paths of the parallel circuit of filters; and
    generating an output signal based on the processed input signal, wherein processing the input signal through the parallel circuit of filters and generating the output signal are performed at an identical sample rate.

11. The method of claim 10, wherein the input signal is an audio signal.

12. The method of claim 10, wherein the input signal is a single bit digital signal.

13. The method of claim 10, wherein the FIR filter comprises of addition operations and no multiplier operations.

14. The method of claim 10, wherein one of the paths of the parallel circuit of filters is in series with a delay module in the input interface.

15. The method of claim 10, wherein processing the input signal through the parallel circuit of filters comprises leaving a last octave of out-of band noise in the processed input signal.

16. The method of claim 15, wherein generating the output signal comprises removing the last octave of out-of band noise from the processed input signal.

17. The method of claim 16, wherein generating the output signal comprises performing an addition operation on the processed input signal from each of the two paths of the parallel circuit.

18. The filtering system of claim 1, wherein the IIR filter is an Allpass Filter.

19. The filtering system of claim 18, wherein the Allpass Filter comprises a series of allpass stages.

* * * * *